United States Patent [19]

Wassink

[11] Patent Number: 5,048,119
[45] Date of Patent: Sep. 10, 1991

[54] BROADCAST RECEIVER FOR RADIO OR TELEVISION SIGNALS WITH STORAGE AND INTERCHANGE OF PRESET STATIONS

[75] Inventor: Derk J. C. Wassink, Eindhoven, Netherlands

[73] Assignee: U.S. Philips Corporation, New York, N.Y.

[21] Appl. No.: 348,233

[22] Filed: May 5, 1989

[30] Foreign Application Priority Data

Feb. 22, 1989 [NL] Netherlands .......................... 8900430

[51] Int. Cl.⁵ ............................................ H04B 17/02
[52] U.S. Cl. ..................................... 455/161; 455/186
[58] Field of Search ............... 455/161, 166, 167, 156, 455/185, 186, 175, 345; 341/22, 23, 27

[56] References Cited

U.S. PATENT DOCUMENTS

| | | | |
|---|---|---|---|
| 4,271,532 | 6/1981 | Wine | 455/186 |
| 4,367,559 | 1/1983 | Tults | 455/186 |
| 4,561,112 | 12/1985 | Ridder | 455/166 |
| 4,667,183 | 5/1987 | Gaudio | 341/27 |

Primary Examiner—Reinhard J. Eisenzopf
Assistant Examiner—Lisa Charouel
Attorney, Agent, or Firm—Edward W. Goodman

[57] ABSTRACT

A broadcast receiver such as a car radio has an electronic tuning circuit and a memory for storing preset stations. The strongest receivable transmitters in the surroundings are searched and stored in the memory by means of an automatic storage program. Subsequently the stored transmitters can be selected in a given sequence by means of successive program keys. To improve convenience of operation, the control circuit in the broadcast receiver further comprises an interchange program 21 so as to interchange the tuning values of preset stations stored in the memory. The stored stations can be subsequently selected by means of the successive program selection keys in a sequence desired by the user.

4 Claims, 3 Drawing Sheets

BROADCAST RECEIVER FOR RADIO OR TELEVISION SIGNALS WITH STORAGE AND INTERCHANGE OF PRESET STATIONS

BACKGROUND OF THE INVENTION

1. Field of the Invention

The invention relates to a broadcast receiver for radio or television signals, particularly a receiver of the portable type or of the mobile built-in type. Such a receiver may be, for example, a portable radio or television set or a car radio.

2. Description of the Prior Art

A broadcast receiver for radio or television signals has a tuning circuit with which the receiver is tuned to a desired broadcast transmitter. In inexpensive sets, this tuning is effected by means of a knob, with a pointer being moved along a frequency scale. More expensive receivers generally have an electronic tuning circuit and a display on which the received frequency is displayed digitally. Moreover, these receivers generally have program keys enabling a user to directly tune to a plurality of preset stations.

Searching of stations and storing preset stations under the program keys, hereinafter referred to as storage procedure, may proceed, for example as follows. After a tuning key is operated, a control circuit in the receiver searches a station having a sufficient signal strength. The user can subsequently store the received station under a selected program key, for example, by operating the relevant program key for at least a given period of time. A tuning value which is characteristic of the received station is stored in response thereto in a storage medium. This operation should be repeated for each available program key. After the storage procedure, the user tunes to a station by operating the relevant program key. The tuning value assigned to this key in the storage medium is then applied to the tuning circuit.

Such a manual storage procedure is time-consuming and often cumbersome. This is not an insurmountable problem when using stationary receivers. However, when using portable receivers which are taken along on, for example, holidays, the storage procedure should be carried out again at every location. The problem is notably manifest in car radios for which the conditions of reception vary continually during long-distance rides.

Therefore, automatic storage procedures as described in Reference [1] are sometimes used in car radios. After a so-called autostore command is generated by the user, the control circuit in the receiver proceeds through an automatic storage program during which stations are uninterruptedly searched and stored under successive program keys until all program keys have been used or no other station with a sufficient signal strength is found any longer. In such an automatic storage procedure, the sequence of storage of the tuning values characteristic of the stations in the storage medium, and hence the sequence of preset stations stored under the successive program keys, is entirely determined by the control circuit. In fact, there is no interaction with the user. For example, a control circuit as described in Reference [1] generates a series of tuning values at an increasing frequency and a decreasing signal strength. The user himself should ascertain and remember which station is stored under which program key. Furthermore, the sequence may be different again after a renewed start of the automatic storage procedure, for example at a different location. This is generally found to be disturbing.

Unwanted stations may be removed by the user. This is notably useful in the case of FM reception in which a given radio program is likely to be transmitted by a plurality of receivable transmitters and is set under more than one program key by means of the automatic storage program. The user then tunes to such an unwanted station by means of the relevant program key and subsequently generates a so-called autoreplace command, for example by operating the relevant program key for a given period of time. The control circuit then searches the next station, which has not yet been preset and subsequently replaces the tuning value of the selected unwanted station in the storage medium by the tuning value of the new station.

Furthermore, a car radio is known which has two selectable memory banks, a first bank for storing manually found tuning values and a second bank for storing automatically found tuning values. Such a combination is very useful, considering that it is now possible to regularly search the locally receivable stations in a simple manner by means of the automatic storage procedure during long car rides and to store them in the second memory bank and, when coming home, to switch back to the first memory bank in which the manually programmed stations are stored in their familiar sequence.

OBJECT AND SUMMARY OF THE INVENTION

The invention has for its object to improve the convenience of operation of broadcast receivers having electronic tuning circuits and a facility for automatically storing stations in a memory.

To this end the receiver according to the invention comprises means for generating an interchange command and the control circuit is adapted to interchange, in response to the occurrence of such an interchange command, a first selected tuning value and a second selected tuning value in the storage medium. This provides the possibility of interchanging two stored stations, while the stations stored in a given sequence by means of the automatic storage program can be set in a simple manner under the successive program keys in a sequence desired by the user. This will be appreciated very much, considering that storing stations in a desired sequence in known car radios is only possible when using the said time-consuming and cumbersome manual storage procedure. This considerably enhances the convenience of operation. Moreover, the manual storage procedure and the operating means required for this purpose can be dispensed with, so that the receiver can be manufactured at lower cost.

Two selected tuning values in the storage medium are interchanged, for example, if successively the first tuning value is selected, the interchange command has occurred and (if) subsequently the second tuning value is selected within a predetermined time after the occurrence of the interchange command. By means of a program key, the user thus tunes to one of the stations to be interchanged, generates the interchange command and selects, for example within 3 seconds, the other station to be interchanged. It is not necessary to keep the program key depressed for some time and the control circuit need not distinguish between depressing and releasing this key. This provides the possibility of using switches for the program keys which are mechanically retained in their depressed position. The user can then tell by the position of the switches which station he has tuned to. A display facility for this purpose is now superfluous, which has a further cost-saving effect.

In a preferred embodiment of the receiver, the interchange command is generated by depressing and keeping depressed an existing and required key and by releasing said key after a predetermined period of time has elapsed, which is marked by the occurrence of an auditive or visual signal which is recognizable as such. It is notably useful if the operating commands relating to the storage procedure are accommodated under one key. To prevent unintentional actions, there is no effect if the key is depressed for a short time. If the key is depressed for a longer time, one beep is generated after, for example 2 seconds, five beeps are generated after 4 seconds and an attractive short melody is generated after 6 seconds. By releasing the key after one beep, for example, the autoreplace command is generated with which, as described hereinbefore, an unwanted station is replaced by another station which has not previously been stored. A release of the key after five beeps generates, for example, the autostore command with which the automatic storage program is started. Finally, a release of the key after the attractive melody generates the interchange command.

A very attractive embodiment of the receiver according to the invention is obtained by dividing the storage medium for storing tuning values into two selectable memory banks which are each used for storing automatically found tuning values. The user uses the automatic storage program and the means for interchanging tuning values in a first memory bank for the purpose of presetting stations in a desired sequence in his normal residential area, and he uses the automatic storage program for fast and simple storage of the strongest receivable stations in a second memory bank during long car rides or on business trips or holidays.

REFERENCE

[1] Broadcast receiver with automatic broadcast station storage. European patent application No. 0,125,717.

DESCRIPTION OF EMBODIMENTS

General Structure

Figure 1:
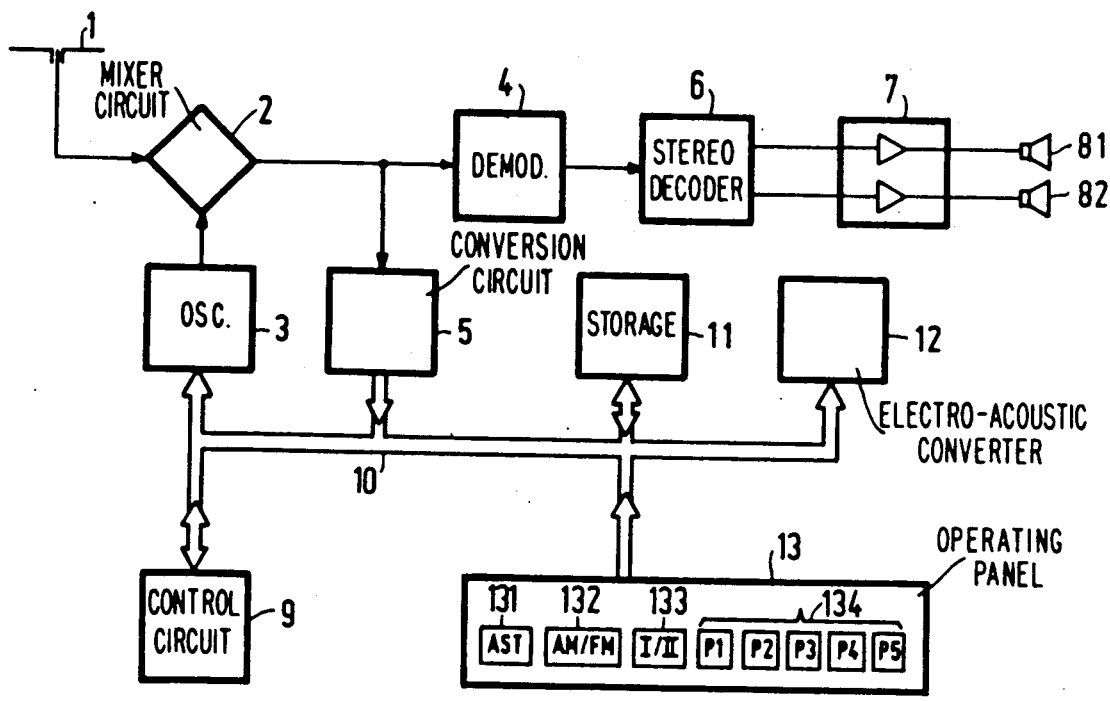
FIG. 1 shows the general structure of a car radio with a memory for storing preset stations.

An embodiment of a car radio is described, whose general structure is shown in FIG. 1. The transmitter signals received at an aerial 1 are applied to a mixer circuit 2, together with an oscillation signal generated in an oscillator 3. The intermediate frequency signal obtained from mixer circuit 2 is subsequently applied to a demodulator 4 and to a conversion circuit 5. The output signal of demodulator 4 is applied to a stereo decoder 6 which applies the received audio signals for the left and right sound channels to loudspeakers 81 and 82 via a dual amplifier 7. The car radio is also provided with a control circuit 9, preferably in the form of a microprocessor, and a command bus 10 connected thereto. The oscillator 3, the conversion circuit 5, a storage medium 11, an electro-acoustic converter 12 and an operating panel 13 are connected to this command bus 10. Conversion circuit 5 is adapted to detect the signal strength of a received station. This signal strength is converted into a number, which is representative thereof and which is applied to control circuit 9 via command bus 10. The electro-acoustic converter 12 is adapted to generate auditive signals such as beeps and attractive short melodies. Operating panel 13 has operating means such as, inter alia, a programming key 131 marked AST, in the form of a push-button, a band selection switch 132 marked AF/FM, a memory bank selection switch 133 marked I/II and a number, for example 5, of mechanically coupled program selection switches 134 marked P1 to P5. The elements of the car radio which are irrelevant to the description of the invention, such as operating means and circuits for controlling volume, tone and balance are not shown in FIG. 1.

Figure 2:
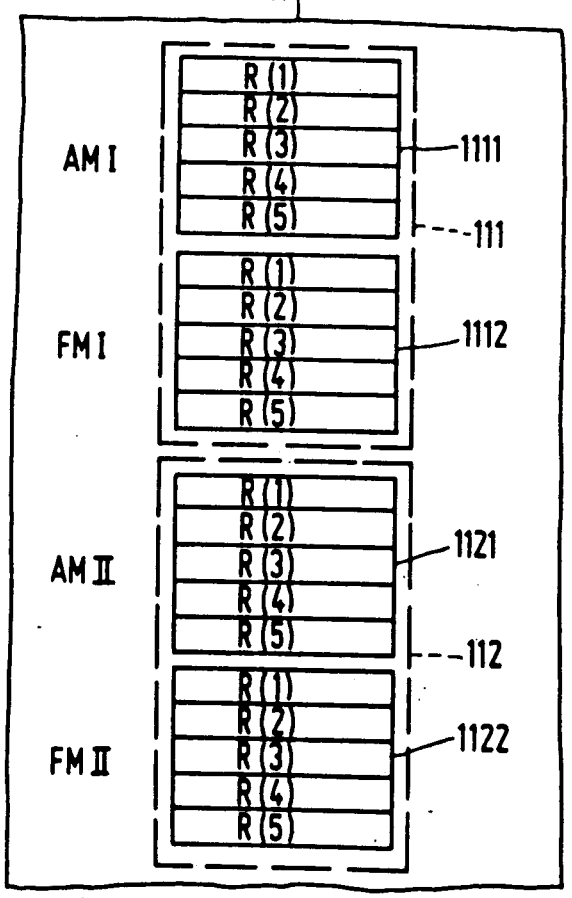
FIG. 2 shows a possible organogram of a memory for storing preset stations.

Tuning to a station is effected by applying a tuning value to the oscillator 3, which value is characteristic of the station to be received. Such a tuning value consists of, for example a number which is a measure of the transmitter frequency to be received. The tuning values characteristic of a plurality of transmitters are stored in registers of the storage medium 11. FIG. 2 shows an example in which the storage medium is divided into a memory bank 111 for storing tuning values of stations during long car rides and on far destinations (memory bank switch 133 in position I) and a memory bank 112 for storing tuning values of stations in the normal residential area (memory bank switch 133 in position II). Both memory banks are further divided into memory blocks 1111 and 1121, respectively, for storing tuning values of transmitters in the AM band (band selection switch 132 in position AM) and memory blocks 1112 and 1122, respectively, for storing tuning values of transmitters in the FM band (band selection switch 132 in position FM). The number of registers in such a block of the storage medium is the same as the number of program selection switches 134, i.e. five in this embodiment.

Receiver Operation

The operation of the car radio shown in FIG. 1 is determined by a control program which is set in the control circuit 9 formed as a microprocessor. For the description it is assumed that one of the four memory blocks is selected by means of band selection switch 132 and memory bank switch 133 and that all operations in storage medium 11 therefore relate to the 5 registers within the selected memory block. The registers in such a selected memory block are briefly referred to as R(1) to R(5).

By operating one of the program selection switches 134, for example P2, the tuning value in the corresponding register, i.e. R(2) in this example, is read in known manner by control circuit 9 and applied to oscillator 3 via command bus 10. The car radio is thereby tuned to the selected frequency.

Figure 3:
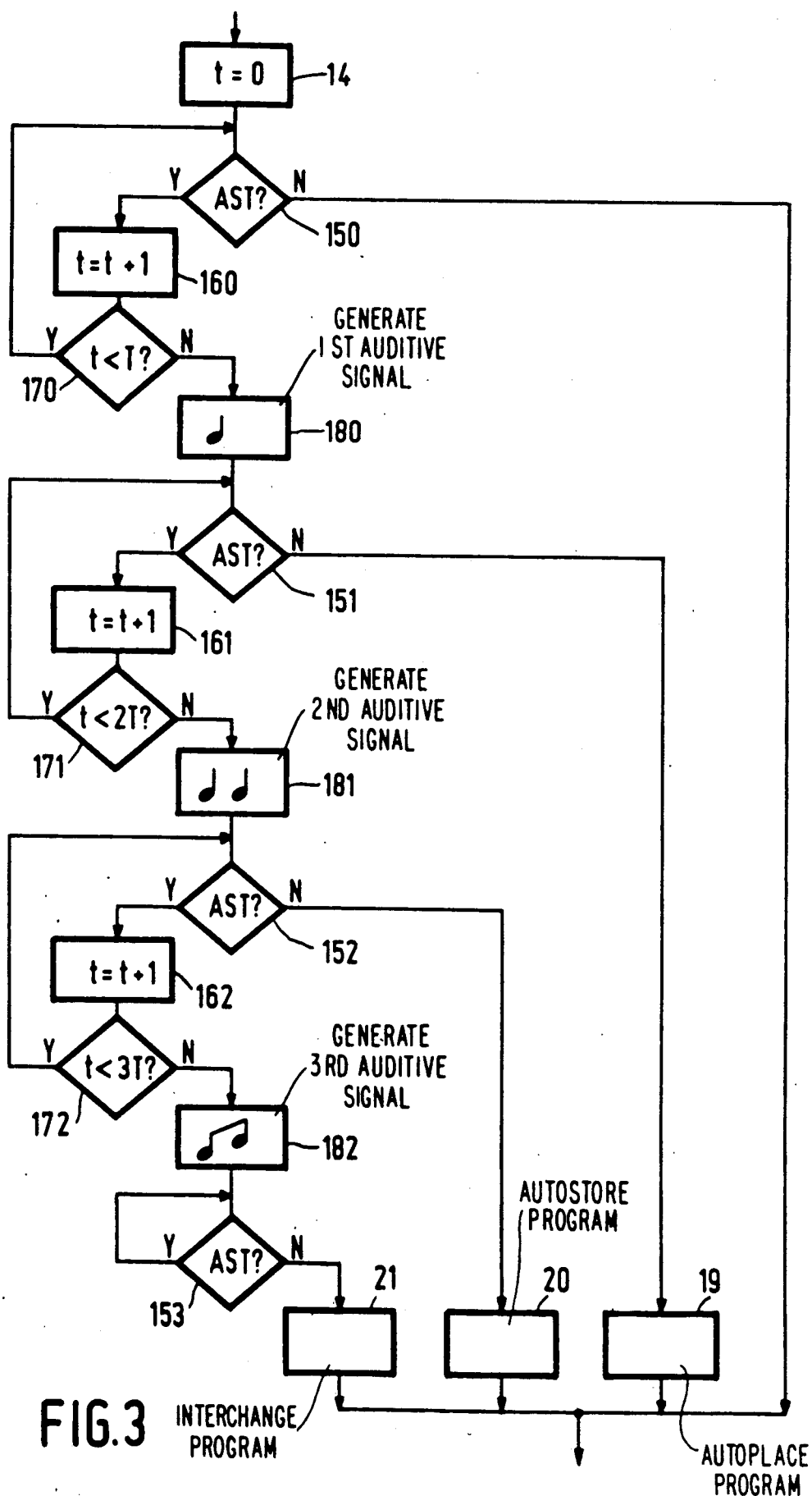
FIG. 3 shows a flowchart describing the storage program of the car radio shown in FIG. 1.

FIG. 3 shows a storage program performed by the control circuit, in response to depressing and releasing programming key 131. After the key has been depressed, a variable t in step 14 is rendered zero. Subsequently, the control program checks in step 150 whether the programming key is still depressed. If this is the case, the variable t is raised by 1 in step 160, whereafter it is checked in step 170 whether t is still smaller than a given threshold value T. If this is the case, the control program returns to step 150 so as to check whether the programming key is still depressed. The threshold value T is hereby chosen to be such that the loop comprising the successive steps 150, 160 and 170 is left after a predetermined time, for example, 2 seconds so as to proceed with the storage program. If the program key is released within this period, the storage program is terminated without any further operations via step 150.

After the programming key has been depressed for at least 2 seconds, step 180 is performed. This step comprises the control in known manner of the electro-acoustic converter 12 with which a first recognizable auditive signal for example one beep is generated. In the same way as described hereinbefore, it is subsequently checked in a loop now comprising steps 151, 161 and 171, whether the programming key has been released before the variable t has reached a threshold value 2T. If this is the case, the control circuit changes over to performing an autoreplace program 19 for replacing an unwanted station. This autoreplace program comprises the steps of searching in known manner a station which has not yet been stored and storing the tuning value of this station in the memory register corresponding to the depressed program selection switch.

The autoreplace program is not carried out if programming key 131 is still depressed after 4 seconds. In that case step 181 is performed in which a second auditive signal now consisting of, for example, five beeps is generated. Subsequently it is checked, in a manner as already described, in a loop now comprising steps 152, 162 and 172, whether the programming key has been released before the variable t has reached the threshold value 3T. If this is the case, the control circuit changes over to performing an autostore program 20. During this autostore program, the registers R(1) to R(5) in the selected memory block of storage medium 11 are filled in an autonomous manner with the tuning values of the strongest receivable stations in the selected AM or FM band. To this end, the control circuit 9 applies tuning values, which increase in magnitude, in the selected band to oscillator 3. During this tuning operation, the signal strengths detected in conversion circuit 5 are compared with a threshold value and in the case of a sufficient signal strength, the tuning value applied to oscillator 3 at that moment is stored in successive registers. These steps are repeated until all available memory registers in the selected band are filled. If the entire band has been traversed and if not all memory registers are filled, the same procedure is repeated again, but at a lower threshold value so that also stations having a weaker signal strength are stored.

Autostore program 20 is not performed if the programming key is still depressed after 6 seconds. Then step 182 is performed in which a third auditive signal, now, for example a short attractive melody is generated. The storage program now waits further in step 153 for the release of the programming key and when this happens, it performs an interchange program 21.

Figure 4:
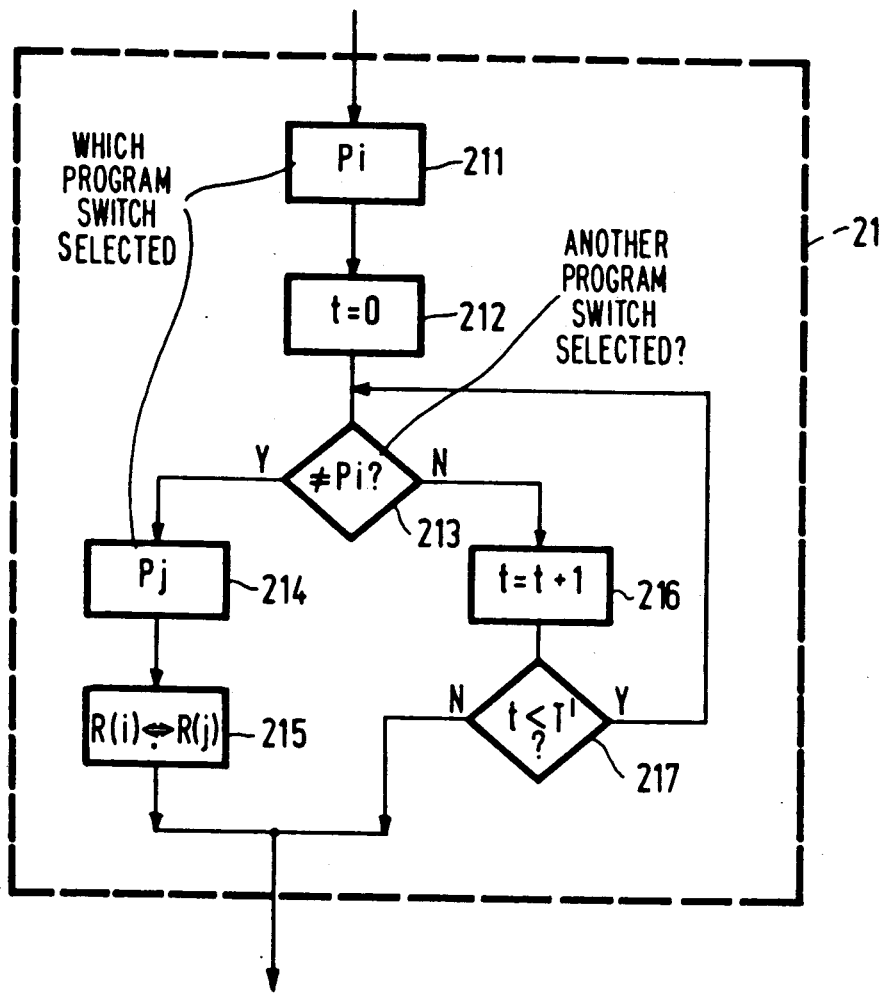
FIG. 4 shows a flowchart describing the interchange program of the flowchart of FIG. 3.

The interchange program 21 is further shown in FIG. 4. In step 211 it is determined which program selection switch Pi of the program selection switches P1 to P5 was depressed when the program key was released, whereafter in a step 212 a variable t is rendered zero.

Subsequently, it is checked in a step 213 whether a program selection switch other than Pi has been subsequently depressed. If this is the case, it is determined in step 214 which program selection switch Pj is depressed and subsequently the tuning values in memory registers R(i) and R(j) are interchanged in a step 215. As long as no program selection switch other than Pi is depressed, the interchange program proceeds through a loop in a manner described hereinbefore, which loop comprises step 213, a step 216 for raising the variable t and a step 217 for comparing t with a threshold value T'. In this way the interchange program is left without any modifications in the storage medium, if one of the program selection switches is not depressed within, for example 3 seconds.

Figures 5A, 5B, 5C:
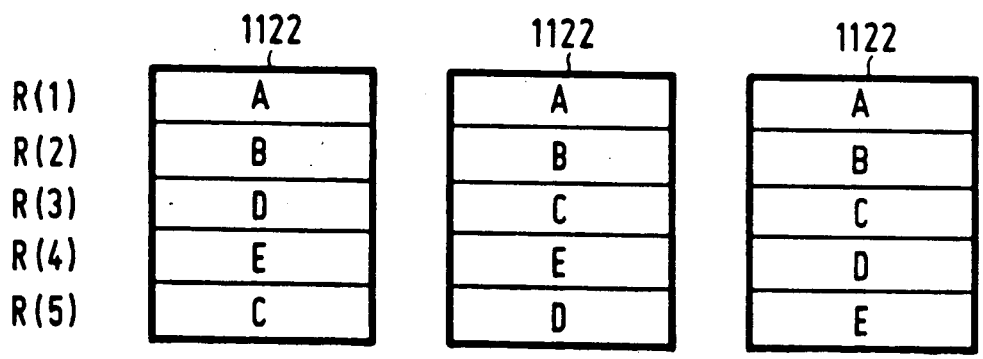
FIGS. 5A-5C show diagrams of a memory block for which the interchange program of FIG. 4 is used.

FIGS. 5A–5C show by way of example how the tuning values stored in memory block 1122 for FM transmitters in memory bank II are given a desired sequence by performing interchange program 21. FIG. 5A shows the obtained sequence of the stations A to E after performing autostore program 20 and possibly autoreplace program 19. FIG. 5B shows the sequence after successively P3 is depressed, the interchange command has occurred and P5 is depressed. FIG. 5C shows the sequence after P4 and P5 have been interchanged in the same manner.

I claim:

1. A broadcast receiver for radio or television signals, comprising:
   a tuning circuit for tuning the receiver to a broadcast transmitter in response to an applied tuning value representing said broadcast transmitter;
   a storage medium for storing a plurality of tuning values, each tuning value representing a pre-programmed broadcast transmitter;
   an operating panel having a plurality of means for generating selection commands corresponding, respectively, to said plurality of tuning values, and means for generating a storage command; and
   a control circuit having means for applying a tuning value of the storage medium corresponding to a selected one of said selection commands generating means to the tuning circuit, and further having means for searching a plurality of locally receivable broadcast transmitters and storing their respective tuning values in said storage medium in response to said storage command, wherein said operating panel further comprises means for generating an interchange command, and the control circuit further comprises means for interchanging a first tuning value in said storage medium selected by a first of said selection commands generating means and a second tuning value in said storage medium selected by a second of said selection commands generating means in response to said interchange command, whereby said first selection commands generating means then corresponds to said second tuning value and said second selection commands generating means corresponds to said first tuning value.

2. A broadcast receiver for radio or television signals as claimed in claim 1, characterized in that said first tuning value and said second tuning value in the storage medium are interchanged, when, successively, (1) the first tuning value is selected, (2) the interchange command is generated, and then (3) the second tuning value is selected within a predetermined time after the generation of the interchange command.

3. A broadcast receiver for radio or television signals as claimed in claim 1 or 2, characterized in that said interchange command is generated by depressing and keeping depressed a key on said operating panel and by releasing said key after a predetermined period of time has elapsed, which is indicated by the occurrence of an auditive or visual signal which is recognizable as such.

4. A broadcast receiver for radio or television signals as claimed in claim 1 or 2, in which the storage medium is divided into at least two selectable memory banks each for storing at least two tuning values, characterized in that said interchange of two tuning values in response to said interchange command is performed in a selected memory bank.

* * * * *